United States Patent
Chapple-Sokol et al.

(10) Patent No.: US 7,572,650 B2
(45) Date of Patent: Aug. 11, 2009

(54) SUPPRESSION OF LOCALIZED METAL PRECIPITATE FORMATION AND CORRESPONDING METALLIZATION DEPLETION IN SEMICONDUCTOR PROCESSING

(75) Inventors: Jonathan D. Chapple-Sokol, Essex Junction, VT (US); Terence B. Hook, Jericho, VT (US); Baozhen Li, South Burlington, VT (US); Thomas L. McDevitt, Underhill, VT (US); Christopher A. Ponsolle, Colchester, VT (US); Bette B. Reuter, Essex Junction, VT (US); Timothy D. Sullivan, Underhill, VT (US); Jeffrey S. Zimmerman, Hinesburg, VT (US)

(73) Assignee: International Business Machnines Corporation, Armonk, NY (US)

( * ) Notice: Subject to any disclaimer, the term of this patent is extended or adjusted under 35 U.S.C. 154(b) by 227 days.

(21) Appl. No.: 11/550,853

(22) Filed: Oct. 19, 2006

(65) Prior Publication Data
US 2007/0040277 A1 Feb. 22, 2007

Related U.S. Application Data

(62) Division of application No. 10/708,486, filed on Mar. 6, 2004, now Pat. No. 7,173,338.

(51) Int. Cl.
*H01L 21/00* (2006.01)

(52) U.S. Cl. .................... 438/17; 438/687; 257/E21.59

(58) Field of Classification Search ......... 438/618–627, 438/639, 640, 14, 17, 18, 687; 257/345, 257/348, 355, 356, 503, E23.161, E23.169, 257/E23.17, 734, 758–760
See application file for complete search history.

(56) References Cited

U.S. PATENT DOCUMENTS

| 6,177,349 B1 | 1/2001 | Schonauer et al. |
| 6,197,690 B1 | 3/2001 | Schonauer et al. |
| 6,319,833 B1 | 11/2001 | Schonauer et al. |
| 6,365,939 B1 * | 4/2002 | Noguchi ..................... 257/355 |
| 6,596,637 B1 | 7/2003 | Schonauer et al. |
| 6,717,209 B1 * | 4/2004 | Kim et al. ................... 257/328 |

* cited by examiner

*Primary Examiner*—Brook Kebede
(74) *Attorney, Agent, or Firm*—Schmeiser, Olsen & Watts; William D. Sabo

(57) ABSTRACT

A method and structure for suppressing localized metal precipitate formation (LMPF) in semiconductor processing. For each metal wire that is exposed to the manufacturing environment and is electrically coupled to an N region, at least one P+ region is formed electrically coupled to the same metal wire. As a result, few excess electrons are available to combine with metal ions to form localized metal precipitate at the metal wire. A monitoring ramp terminal can be formed around and electrically disconnected from the metal wire. By applying a voltage difference to the metal wire and the monitoring ramp terminal and measuring the resulting current flowing through the metal wire and the monitoring ramp terminal, it can be determined whether localized metal precipitate is formed at the metal wire.

8 Claims, 8 Drawing Sheets

SUPPRESSION OF LOCALIZED METAL PRECIPITATE FORMATION AND CORRESPONDING METALLIZATION DEPLETION IN SEMICONDUCTOR PROCESSING

This application is a Divisional of Ser. No. 10/708,486, filed Mar. 6, 2004 now U.S. Pat. No. 7,173,338.

BACKGROUND OF THE INVENTION

1. Technical Field

The present invention relates to Localized Metal Precipitate Formation (hereafter referred to as LMPF) and the corresponding metallization depletion, and more particularly, to methods for suppressing and monitoring LMPF, and suppressing interconnect depletion in semiconductor processing.

2. Related Art

During the process of fabricating chips on a semiconductor wafer, there may be at least two electrically isolated metal wires exposed to the manufacturing environment at the surface of the wafer. Due to photo and/or other forms of excitation, one of the two metal wires (hereafter referred to as the first wire) may be at a higher electrical potential than the other metal wire (hereafter referred to as the second wire). When the wafer undergoes a CMP (Chemical Mechanical Polishing) step, during which the wafer is exposed to an ionic solution, some metal atoms (M) of the first wire dissolve in the solution and become ionized ($M \rightarrow M^{n+}$). As a result of the electrical potential difference between the first and second wires, some of these ionized atoms move in the solution from the first wire towards the second wire, and redeposit as localized metal precipitates (LMP) at the second wire ($M^{n+} \rightarrow M$). These LMPs may cause a short-circuit in the devices on the wafer, which would degrade or destroy the ability of these devices to perform their intended function. Also, in some situations, the metal ions that dissolve into the ionic solution are drawn from a very small area of the first metal wire, resulting in localized removal of metal in that wire, often referred to as depletion or erosion of the metal. This localized loss of material from the first wire degrades the current carrying capability of the line and can lead to premature metallization failure.

Therefore, there is a need for a structure to prevent such localized metal precipitate formation and the corresponding metallization depletion. Also, there is a need for a method for forming the structure. There is also a need for a method for monitoring such LMPF.

SUMMARY OF THE INVENTION

The present invention provides a semiconductor structure, comprising (a) an electrically conducting wire; and (b) first and second semiconductor regions being electrically coupled to the electrically conducting wire and being doped with first and second doping types, respectively, wherein the first and second doping types are of opposite doping types, wherein without the second semiconductor region, in response to the first semiconductor region being excited and the electrically conducting wire being directly exposed to an ionic solution, a first current flows between the ionic solution and the first semiconductor region through the electrically conducting wire, and wherein with the presence of the second semiconductor region, in response to the first semiconductor region being excited and the electrically conducting wire being directly exposed to the ionic solution, a second current flows between the first semiconductor region and the second semiconductor region so as to reduce the magnitude of the first current.

The present invention also provides a method for fabricating a semiconductor structure, the method comprising (a) providing in the structure an electrically conducting wire, and first and second semiconductor regions being electrically coupled to the electrically conducting wire and being doped with first and second doping types, respectively, wherein the first and second doping types are of opposite doping types, and wherein without the second semiconductor region, in response to the first semiconductor region being excited and the electrically conducting wire being directly exposed to an ionic solution, a first current flows between the ionic solution and the first semiconductor region through the electrically conducting wire; and (b) in response to the first semiconductor region being excited and the electrically conducting wire being directly exposed to the ionic solution, generating a second current between the first semiconductor region and the second semiconductor region so as to reduce the magnitude of the first current.

The present invention also provides a semiconductor structure, comprising (a) a first semiconductor region doped with a first doping type; and (b) a first photo-blocking layer covered on top of the first semiconductor region and adapted for reducing light reaching and exciting the first semiconductor region.

The present invention also provides a method for identifying LMPF (Localized Metal Precipitate Formation) in a semiconductor structure, the method comprising (i) providing in the semiconductor structure (a) a first electrically conducting wire, (b) a first semiconductor region doped with N type dopants and electrically coupled to the first electrically conducting wire, (c) a monitoring ramp terminal being near the first electrically conducting wire, electrically disconnected from the first electrically conducting wire, and exposed to the atmosphere, and (d) a second electrically conducting wire; (ii) applying a voltage difference to the monitoring ramp terminal and a select wire selected from the group consisting of the first and second electrically conducting wires; and (iii) measuring a current flowing between the select wire and the monitoring ramp terminal so as to determine whether LMPF occurs at the first electrically conducting wire.

The present invention also provides a method for determining the sensitivity degree of a fabrication process performed on a wafer, the method comprising the steps of (a) providing in the wafer a plurality of structures having various LMPF likelihood ratios; (b) monitoring LMPF at each of the plurality of structures and collecting monitoring data; and (c) determining the sensitivity degree of the fabrication process.

DETAILED DESCRIPTION OF THE INVENTION

Figure 1A:
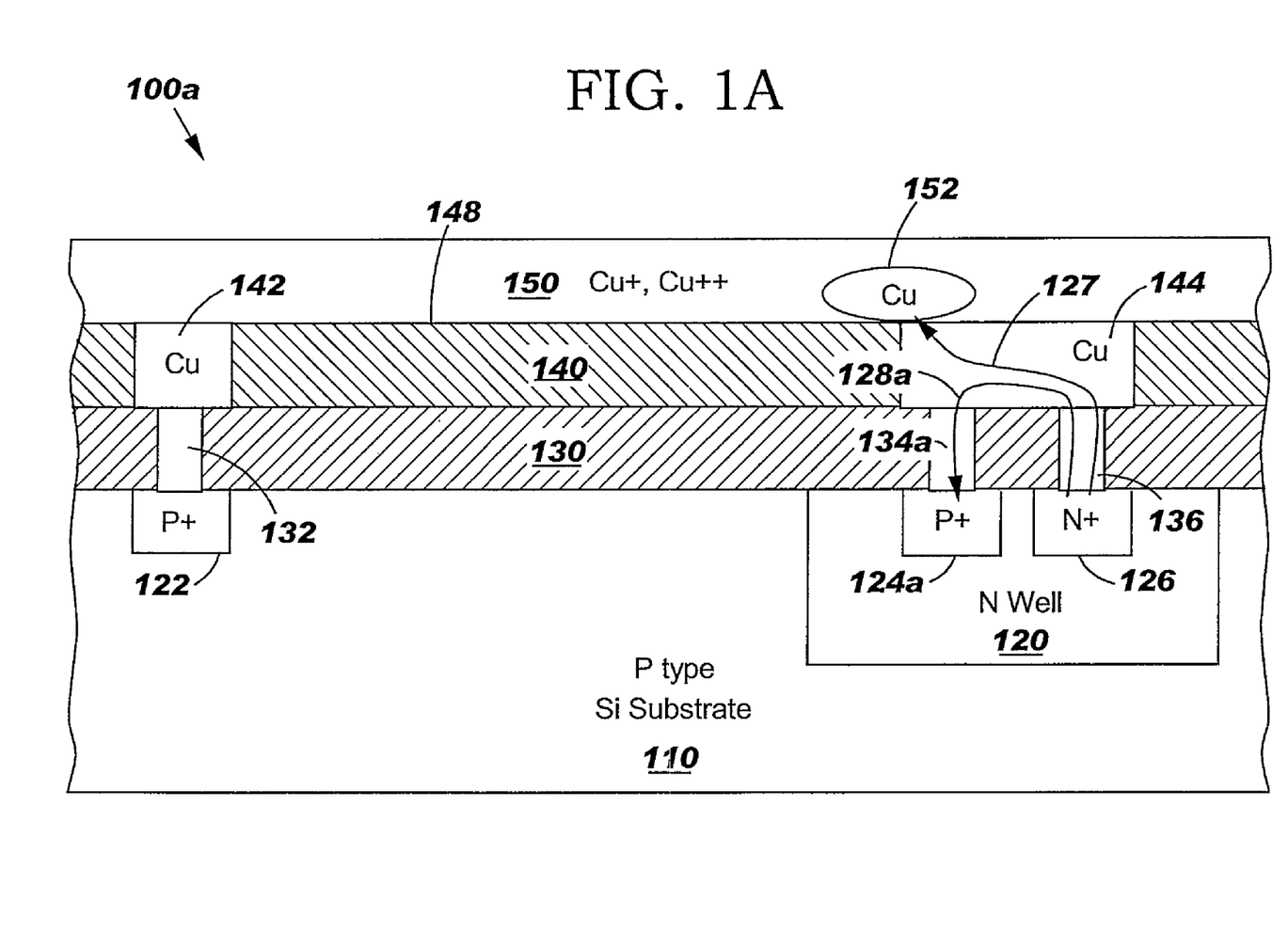
FIGS. 1A-1E illustrate cross-sectional views of different semiconductor structures for suppressing LMPF and the corresponding metallization depletion, in accordance with embodiments of the present invention.

FIG. 1A illustrates a cross-sectional view of a semiconductor structure 100a, in accordance with embodiments of the present invention.

In one embodiment, the structure 100a can be formed by first implanting an N well 120 in a P type silicon substrate 110. Next, two P+ regions 124a and 122 and an N+ region 126 are formed by ion implantation, with the regions 124a and 126 in N well 120.

Dielectric layer 130 is then deposited upon the entire structure and vias 132, 134a, and 136 are formed in the dielectric layer 130 and filled with a conducting material such as copper, tungsten, or any other suitable metal. The vias 132, 134a, and 136 are in direct physical contact with P+ regions 122 and 124a, and N+ region 126, respectively. The N+ region 126 and the P+ region 122 constitute contacts to the N well 120 and the substrate 110, respectively. Excess metal from the deposition process is removed by CMP. Then, dielectric layer 140 is deposited upon the entire structure. Copper (Cu) wires 142 and 144 are then formed in the dielectric layer 140. The copper wire 142 is in direct physical contact with the via 132, and the copper wire 144 is in direct physical contact with the vias 134a and 136.

The formation of wires 142 and 144, as herein described and as shown in structure 100a, is accomplished by a single damascene process. In another embodiment, not shown in the figures, wires 142 and 144, along with their corresponding vias 132, 134a, and 136, can all be formed using a dual damascene (dd) process. In the dd process, dielectric layers 130 and 140 would be deposited together, then vias 132, 134a, and 136, and trenches 142 and 144, are etched (either vias first, then trenches, or in reverse order), and then both vias and trenches are filled at the same time before the CMP step is performed to remove excess metal.

In order to understand how LMPF is suppressed in the structure 100a, assume that the P+ region 124a and the via 134a were not formed in the above-described steps. Under photo excitation (i.e., the transfer of photo energy into the structure 100a) and/or other forms of excitation of the structure 100a, free holes (positive charges) and electrons are created in the P substrate region 110 and N well region 120. Through diffusion and field drift, the free holes can move toward the P+ region 122, and the free electrons can move toward the N+ region 126. As a result, the P+ region 122 (a contact to the P substrate region 110) and N+ region 126 (a contact to the N well 120) become anode and cathode, respectively, of a voltage cell (not shown) with an established electrical potential difference between the two regions 122 and 126.

Assume further that the structure 100a undergoes a CMP (Chemical Mechanical Polishing) step or any other process that exposes the structure 100 to an ionic or electrolytic solution. As a result, an ionic solution 150 of the CMP is applied to the top surface 148 of the structure 100a. The surface where fabrication processes are directed is the top surface of the structure or wafer. With the P+ region 122 and the N+ region 126 being the anode and cathode of the voltage cell, respectively, a current flows from the anode 122 through the via 132, the Cu wire 142, the solution 150, the Cu wire 144, and the via 136 to the cathode 126.

In the solution 150, the current comprises copper ions Cu+ and Cu++ dissolved into the solution 150 from the Cu wire 142 and moving in the solution 150 towards the Cu wire 144. At the Cu wire 144, the copper ions combine with free electrons created in the N well 120 and moving up to the Cu wire 144 through the N+ region 126 and the via 136 (i.e., path 127) so as to form copper localized metal precipitate (LMP) 152 at the Cu wire 144. As a result of some copper atoms of the copper wire 142 being dissolved into the solution 150 as copper ions, the copper wire 142 is depleted of material (i.e., metallization depletion).

The above occurrence describes what would happen without the presence of the P+ region 124a and the via 134a. Now, with the presence of P+ region 124a and the via 134a, most of the excess free electrons created in the N well 120 by the excitation mechanisms mentioned above (photo and/or others) will flow from the N+ region 126 through the via 136, the Cu wire 144, and the via 134a to the P+ region 124a (i.e., path 128a). As a result, fewer free electrons from N well region 120 flow along the path 127 and become available to combine with the copper ions in the solution 150 to form copper LMP 152. In other words, copper LMPF is suppressed.

With fewer free electrons from N well region 120 flowing along the path 127, the current flowing in the solution 150 from the Cu wire 142 to the Cu wire 144 is reduced. As a result, fewer copper atoms of the Cu wire 142 dissolve into the solution 150 as copper ions. In other words, metallization depletion at the Cu wire 142 is also suppressed.

Figure 1B:
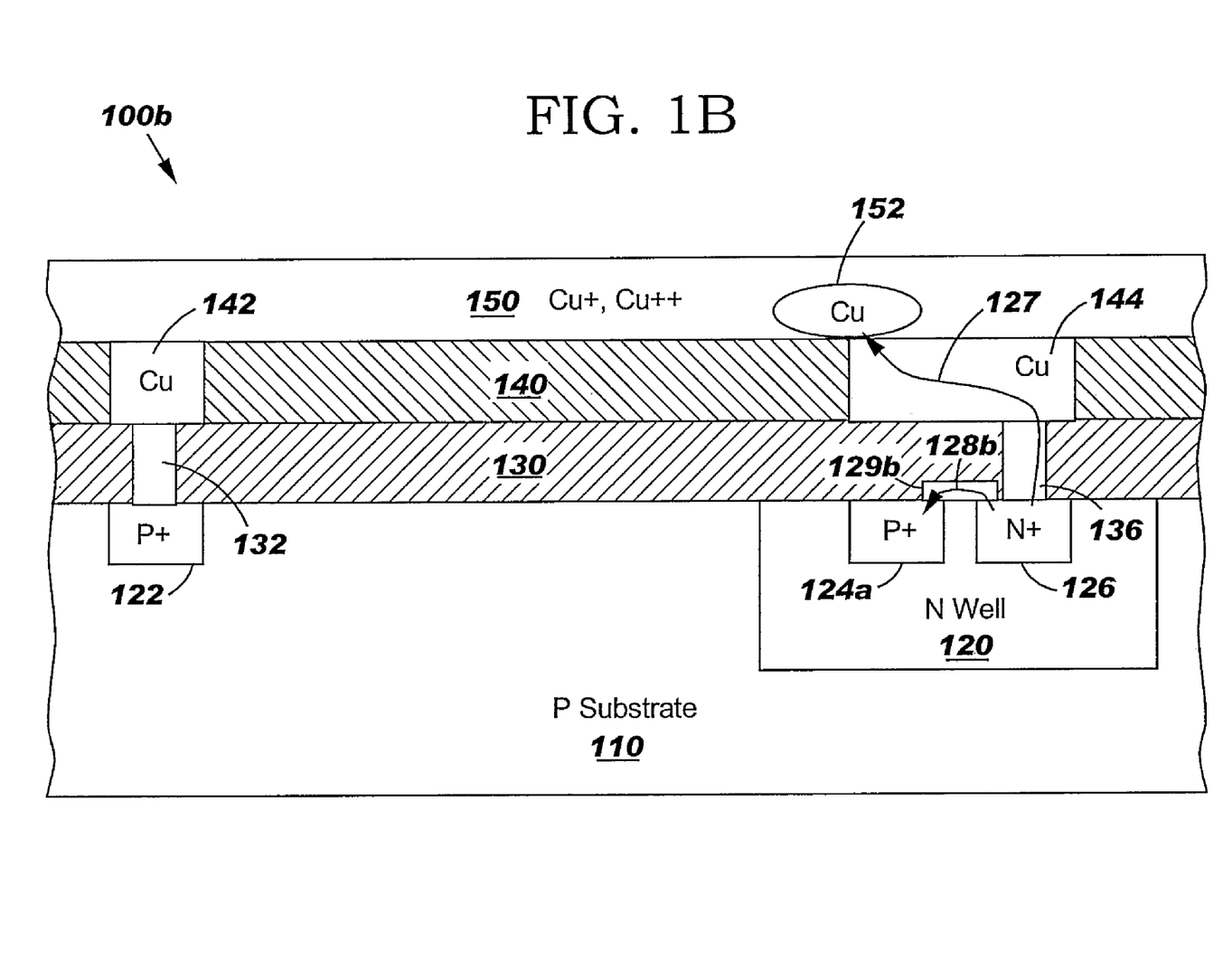

FIG. 1B illustrates a cross-sectional view of another semiconductor structure 100b, in accordance with embodiments of the present invention. The structure 100b is similar to the structure 100a of FIG. 1A, except that the via 134a is omitted and a conducting strap 129b is formed electrically connecting the P+ region 124a and the N+ region 126. As a result, excess free electrons from N well 120, created by the excitation mechanisms mentioned above (photo and/or others), will flow from the N+ region 126 through the conducting strap 129b to the P+ region 124a (i.e., via the path 128b). As a result, substantially fewer free electrons from N well regions 120 flow along the path 127 and become available to combine with the copper ions in the solution 150 to form the copper LMP 152. In other words, copper LMPF is suppressed.

In one embodiment, the conducting strap 129b may comprise a local interconnect material, such as tungsten silicide, cobalt silicide, nickel silicide, or any other suitable interconnect material. If the conducting strap 129b is made of cobalt silicide, for example, it can be formed by depositing a layer of cobalt directly above the P+ region 124a and the N+ region 126. Then, prior to the deposition of dielectric layer 130, the structure 100b is heated up so as to make the cobalt layer react with silicon material of the N well 120 and form the cobalt silicide conducting strap 129b.

With fewer free electrons from N well region 120 flowing along the path 127, the current flowing in the solution 150 from the Cu wire 142 to the Cu wire 144 is reduced. As a result, fewer copper atoms of the Cu wire 142 dissolve into the solution 150 as copper ions. In other words, metallization depletion at the Cu wire 142 is also suppressed.

Figure 1C:
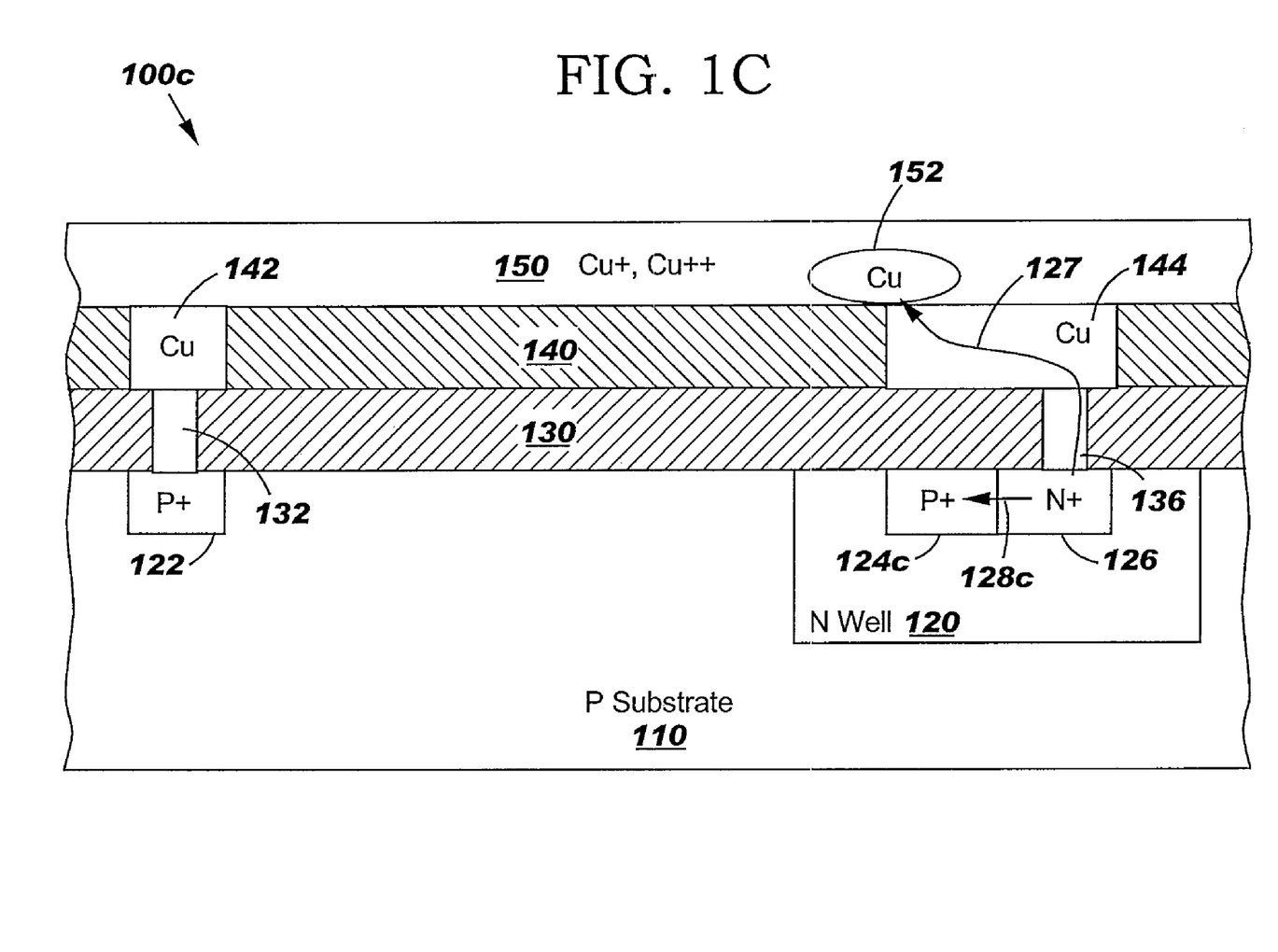

FIG. 1C illustrates a cross-sectional view of another semiconductor structure 100c, in accordance with embodiments of the present invention. The structure 100c is similar to the structure 100b of FIG. 1B, except that the conducting strap 129b is omitted and the P+ region 124a (now referred to as P+ region 124c) are formed abutting (i.e., in physical contact with) the N+ region 126 forming a p-n junction 124c,126.

As a result, most of the free electrons from N well region 120, created by the excitation mechanisms mentioned above (photo and/or others) will forward bias the p-n junction 124c, 126 causing the excess electrons to flow from the N+ region 126 directly to the P+ region 124c (i.e., via the path 128c). As a result, fewer free electrons from N Well regions 120 flow along the path 127 and become available to combine with the copper ions in the solution 150 to form copper LMP 152. In other words, copper LMPF is suppressed.

With fewer free electrons from N well region 120 flowing along the path 127, the current flowing in the solution 150 from the Cu wire 142 to the Cu wire 144 is reduced. As a result, fewer copper atoms of the Cu wire 142 dissolve into the solution 150 as copper ions. In other words, metallization depletion at the Cu wire 142 is also suppressed.

Figure 1D:
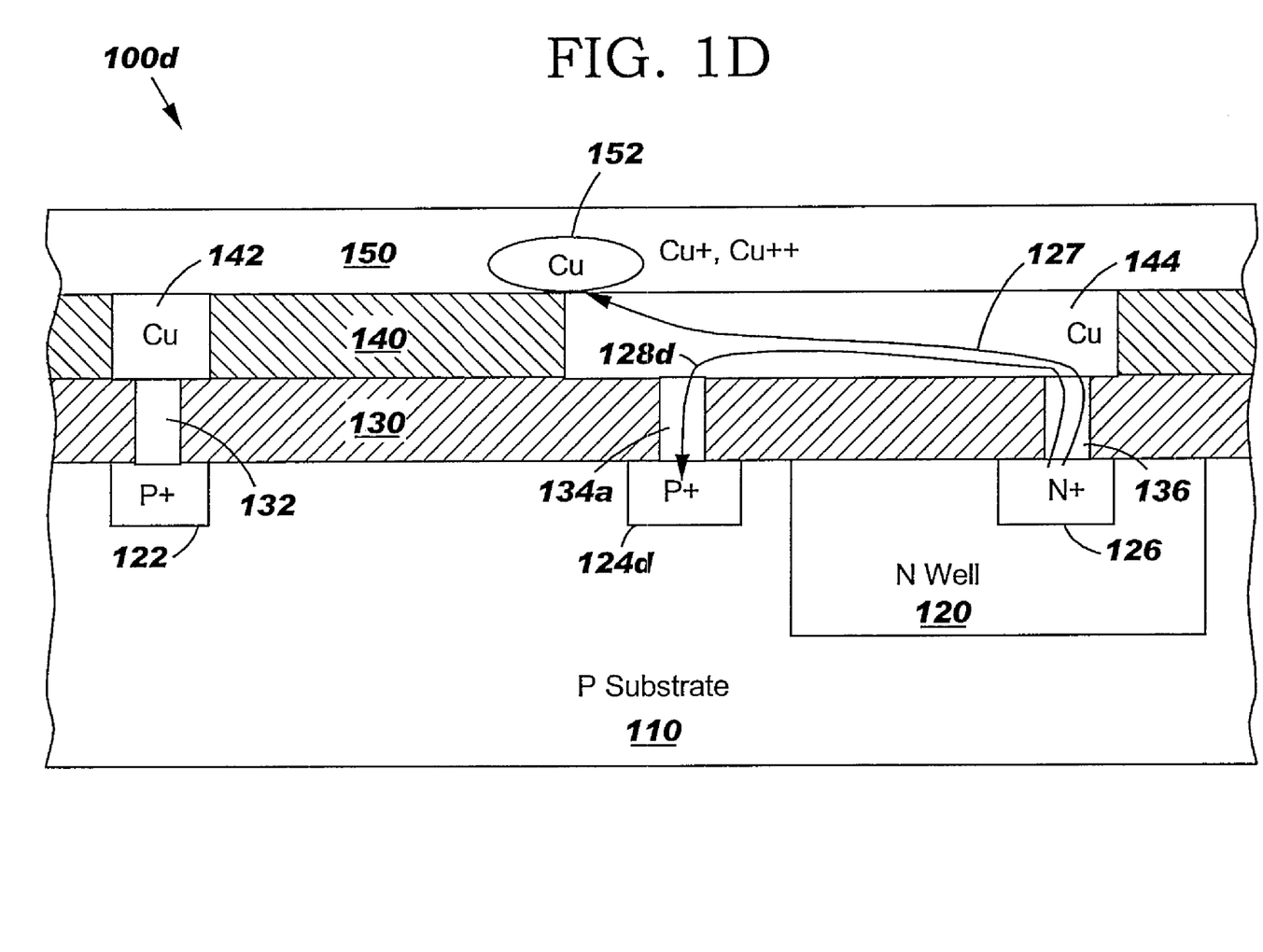

FIG. 1D illustrates a cross-sectional view of another semiconductor structure 100d, in accordance with embodiments of the present invention. The structure 100d is similar to the structure 100a of FIG. 1A, except that the P+ region 124a (now referred to as P+ region 124d) is formed outside the N well 120.

As a result, some of the free electrons from N well region 120, created by the excitation mechanisms mentioned above (photo and/or others) will flow from the N+ region 126 through the via 136, the Cu wire 144, and the via 134a to the P+ region 124d (i.e., via the path 128d). As a result, fewer free electrons from N well regions 120 flow along the path 127 and become available to combine with the copper ions in the solution 150 to form copper LMP 152. In other words, copper LMPF is suppressed. In this configuration, the N well 120 is effectively electrically shorted to the substrate 110.

With fewer free electrons from N well region 120 flowing along the path 127, the current flowing in the solution 150 from the Cu wire 142 to the Cu wire 144 is reduced. As a result, fewer copper atoms of the Cu wire 142 dissolve into the solution 150 as copper ions. In other words, metallization depletion at the Cu wire 142 is also suppressed.

Figure 1E:
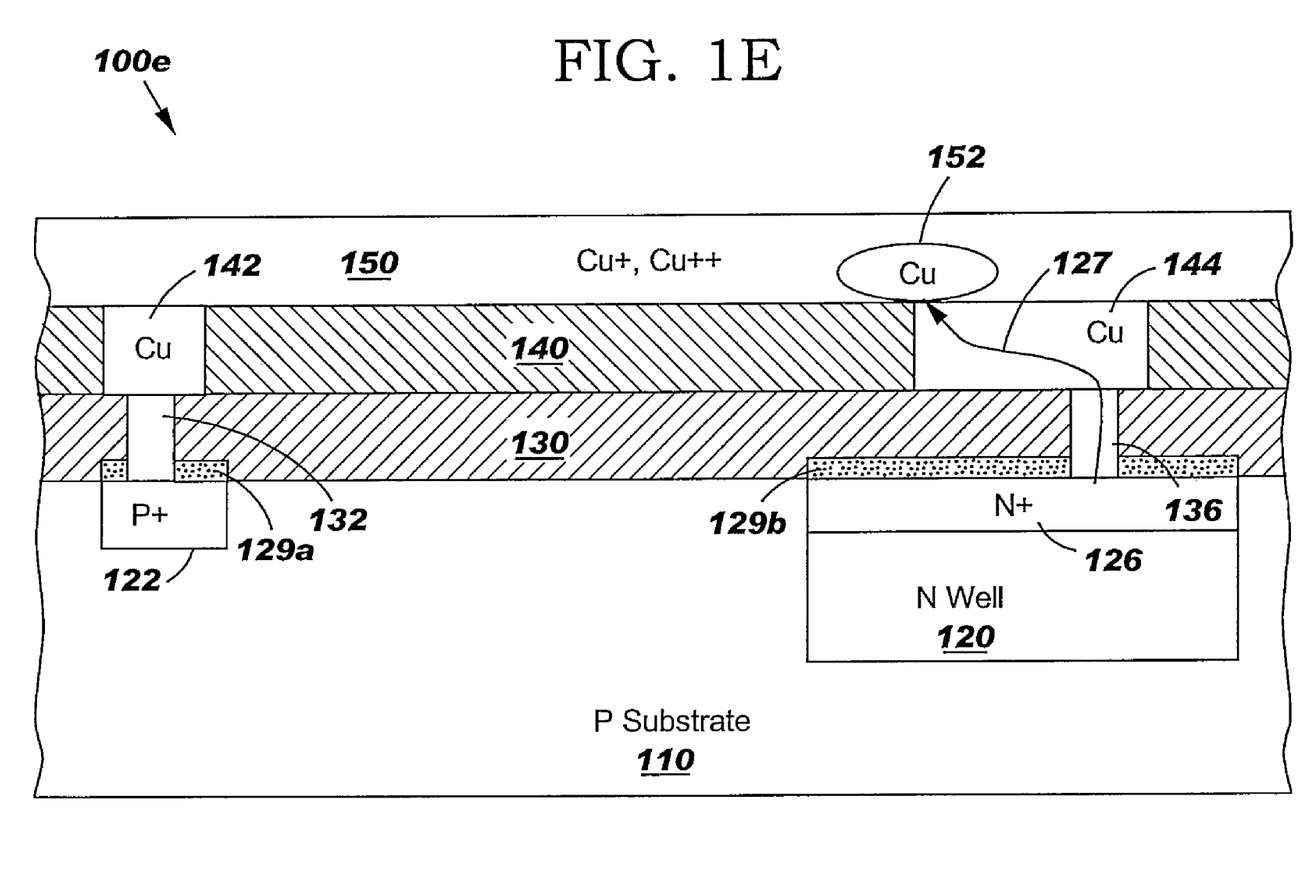

FIG. 1E illustrates a cross-sectional view of another semiconductor structure 100e, in accordance with embodiments of the present invention. The structure 100e is similar to the structure 100a of FIG. 1A, except that the P+ region 124a and the via 134a are omitted, and that photo-blocking layers 129a and 129b are formed directly on the P+ region 122 and the N well 120, respectively.

In one embodiment, the photo-blocking layers 129a and 129b comprise silicide such as cobalt silicide which is capable of preventing light (or in general, electromagnetic waves) from reaching the N well region 120 to create free electrons. More specifically, with the presence of the photo-blocking layer 129b, fewer free electrons are generated to flow along the path 127 and become available to combine with the copper ions in the solution 150 to form copper LMP 152. In other words, copper LMPF is suppressed.

With fewer free electrons from N well region 120 flowing along the path 127, the current flowing in the solution 150 from the Cu wire 142 to the Cu wire 144 is reduced. As a result, fewer copper atoms of the Cu wire 142 dissolve into the solution 150 as copper ions. In other words, metallization depletion at the Cu wire 142 is also suppressed.

In one embodiment, photo-blocking layers 129a and 129b can be formed by depositing layers of metal (such as cobalt) directly above the P+ region 122 and the N well 120. Then, the structure 100e is heated up so as to make the cobalt layers react with silicon material of the P+ region 122 and the N well 120 so as to form the photo-blocking layers 129a and 129b. Subsequent to the high temperature annealing process, unreacted metal may be removed from the wafer in a suitable wet etching process.

Figure 2:
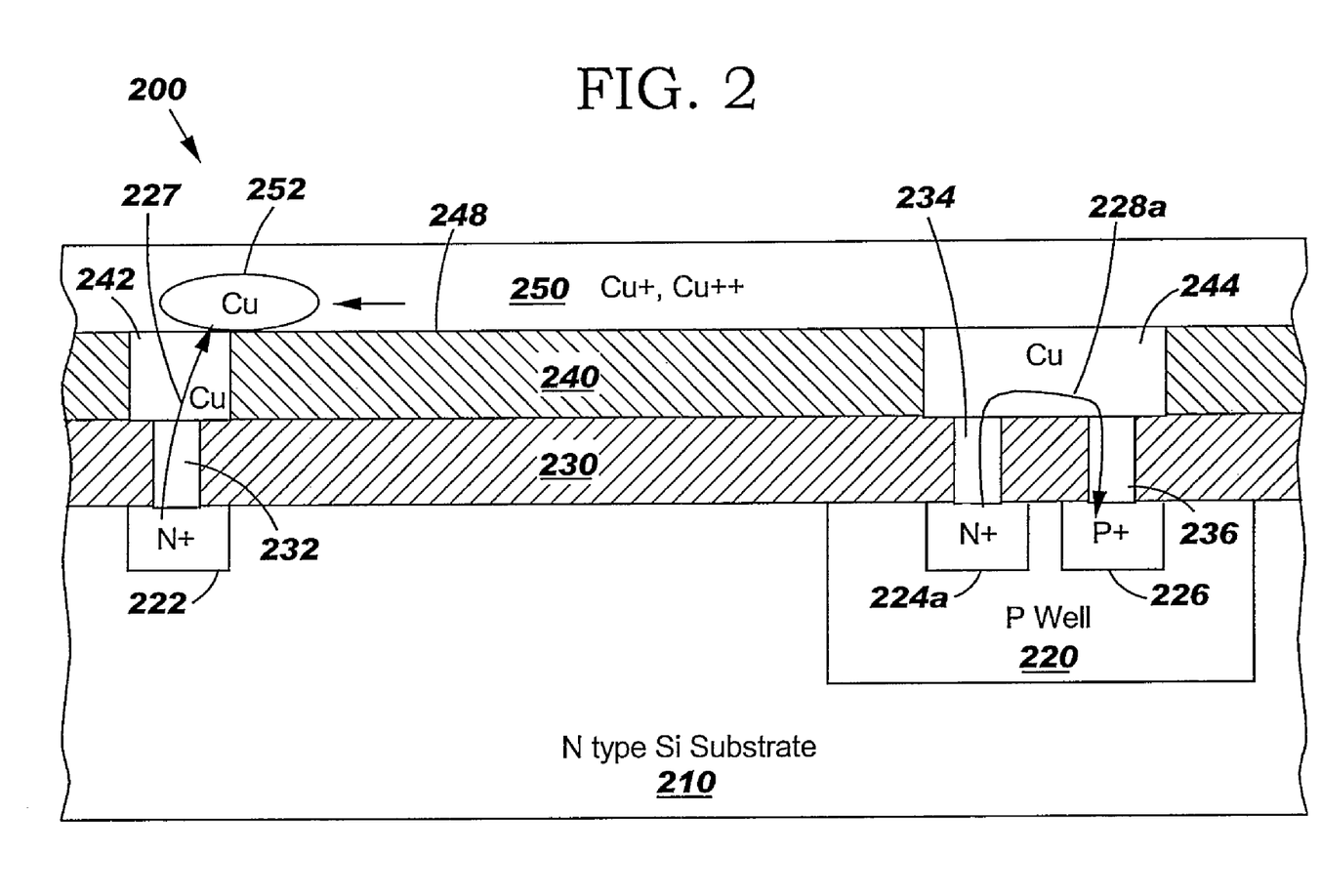
FIG. 2 illustrates a cross-sectional view of another semiconductor structure for suppressing LMPF and the corresponding metallization depletion, in accordance with embodiments of the present invention.

FIG. 2 illustrates a cross-sectional view of yet another semiconductor structure 200, in accordance with embodiments of the present invention. The structure 200 is similar to the structure 100a, except that N+ regions become P+ regions, and P+ regions become N+ regions. For instance, the P+ region 122 of FIG. 1A becomes the N+ region 222 of FIG. 2. In one embodiment, the element 210 may be an n-type substrate. In another embodiment, the element 210 is a large N well region (not shown) embedded in a p-type substrate (not shown).

In order to understand how LMPF is suppressed in the structure 200, assume that the N+ region 224a and the via 234 were omitted in the structure 200. Under photo excitation and/or other forms of excitation of the structure 200, free electrons and holes are created in the N region 210 and P well region 220, respectively. As a result, the N+ region 222 and the P+ region 226 become cathode and anode, respectively, of a voltage cell (not shown).

Assume further that the structure 200 undergoes a CMP (Chemical Mechanical Polishing) step or any other process that exposes the structure to an ionic or electrolytic solution. As a result, an ionic solution 250 is present at the top surface 248 of the structure 200. With the N+ region 222 and the P+ region 226 being the cathode and anode of the voltage cell, respectively, a current flows from the anode 226 through the via 236, the Cu wire 244, the solution 250, the Cu wire 242, and the via 232 to the cathode 222.

In the solution 250, the current comprises copper ions Cu+ and Cu++ dissolved into the solution 250 from the Cu wire 244 and moving in the solution 250 towards the Cu wire 242. At the Cu wire 242, the copper ions combine with the free electrons created in the N region 210 and moving up to the Cu wire 242 through the N+ region 222 and the via 232 (i.e., via the path 227) so as to form copper LMP 252 at the Cu wire 242. As a result of some copper atoms of the copper wire 244 being dissolved into the solution 250 as copper ions, the copper wire 244 is depleted of material (i.e., metallization depletion).

The above occurrence describes what would happen without the presence of N+ region 224a and the via 234. Now, with the presence of the N+ region 224a and the via 234, excess free electrons are created in the N+ region 224a and flow through the via 234, the Cu wire 244, and the via 236 to the P+ region 226 (i.e., via the path 228a). As a result, the concentration of excess free holes in the P well region 220 are substantially reduced, and therefore the potential difference between the P+ region 226 and the N+ region 222 are reduced. As a result, the number of free electrons flowing through the path 227 is substantially reduced. Therefore, fewer free electrons become available at the Cu wire 242 to combine with the copper ions in the solution 250 to form copper LMP 252. In other words, copper LMPF is suppressed.

With fewer free electrons from N+ region 222 flowing along the path 227, the current flowing in the solution 250 from the Cu wire 244 to the Cu wire 242 is reduced. As a result, fewer copper atoms of the Cu wire 244 dissolve into the solution 250 as copper ions. In other words, metallization depletion at the Cu wire 244 is also suppressed.

Other embodiments of the present invention can be obtained by replacing P type regions by N type regions and replacing N type regions by P type regions in the structures 100b, 100c, 100d, and 100e.

In summary, for each N well (like the N well 120 of FIGS. 1A-1D) in a semiconductor structure which is electrically connected to a metal wire, at least one P+ region (P doping type is the opposite doping type of the N doping type), like the P+ regions 124a-124d of FIGS. 1A-1D, respectively, can be formed electrically connected to the same conducting wire. Without this P+ region, and in response to the excitation mechanisms acting upon the N well and substrate regions, and the metal wire being directly exposed to an ionic solution, free electrons (negative charges) would move from the N well to the surface of the metal wire in contact with the ionic solution, attracting and combining with Cu+ and Cu++ ions, which then aggregate locally, forming one or more precipitates at that metal wire. However, with the presence of this P+ region, in response to the excitation mechanisms acting upon the N well and the metal wire being directly exposed to the ionic solution, free electrons, which would otherwise be available to react with metal ions in the ionic solution, are contained within the solid semiconductor material. As a result, excess negative charges that would accumulate at the surface of the metal wire connected to the N well (and in contact with the ionic solution) are reduced or eliminated, and fewer or no Cu+ or Cu++ ions aggregate at the surface of the metal wire. Therefore, localized metal precipitate formation (LMPF) at the metal wire connected to the N well is suppressed. This is illustrated in FIGS. 1A-1D.

Similarly, for each P well (like the P well 220 of FIG. 2) in a semiconductor structure that is electrically connected to a conducting wire, at least one N+ region (like the N+ region 224*a* of FIG. 2) can be formed, electrically connected to the same conducting wire. Without this N+ region, in response to the excitation mechanisms acting upon the P well, and the conducting wire contacting it through the P+ region being directly exposed to an ionic solution, excess free holes (positive charges) would move from the P well to the surface of the conducting wire in contact with the ionic solution, where they produce copper ions, enabling a current to flow through the ionic solution from the P+ region to another conducting wire exposed to the solution and connected to another N+ region. As a result of this current, LMP may form at the other conducting wire that is directly exposed to the ionic solution and electrically coupled to the other N+ region. However, with the presence of this N+ region, in response to the excitation mechanisms acting upon the P well regions and the conducting wire being directly exposed to the ionic solution, free holes which would otherwise be available to produce metal ions in the ionic solution, are contained within the solid semiconductor material. As a result, excess positive charges that would move to the surface of the wire connected to the P well, and in contact with the ionic solution, are reduced or eliminated. Therefore, the current flowing through the ionic solution to the N+ region is reduced or eliminated and LMPF at the conducting wire connected to the N+ region is suppressed. This is illustrated in FIG. 2.

Figure 3A:
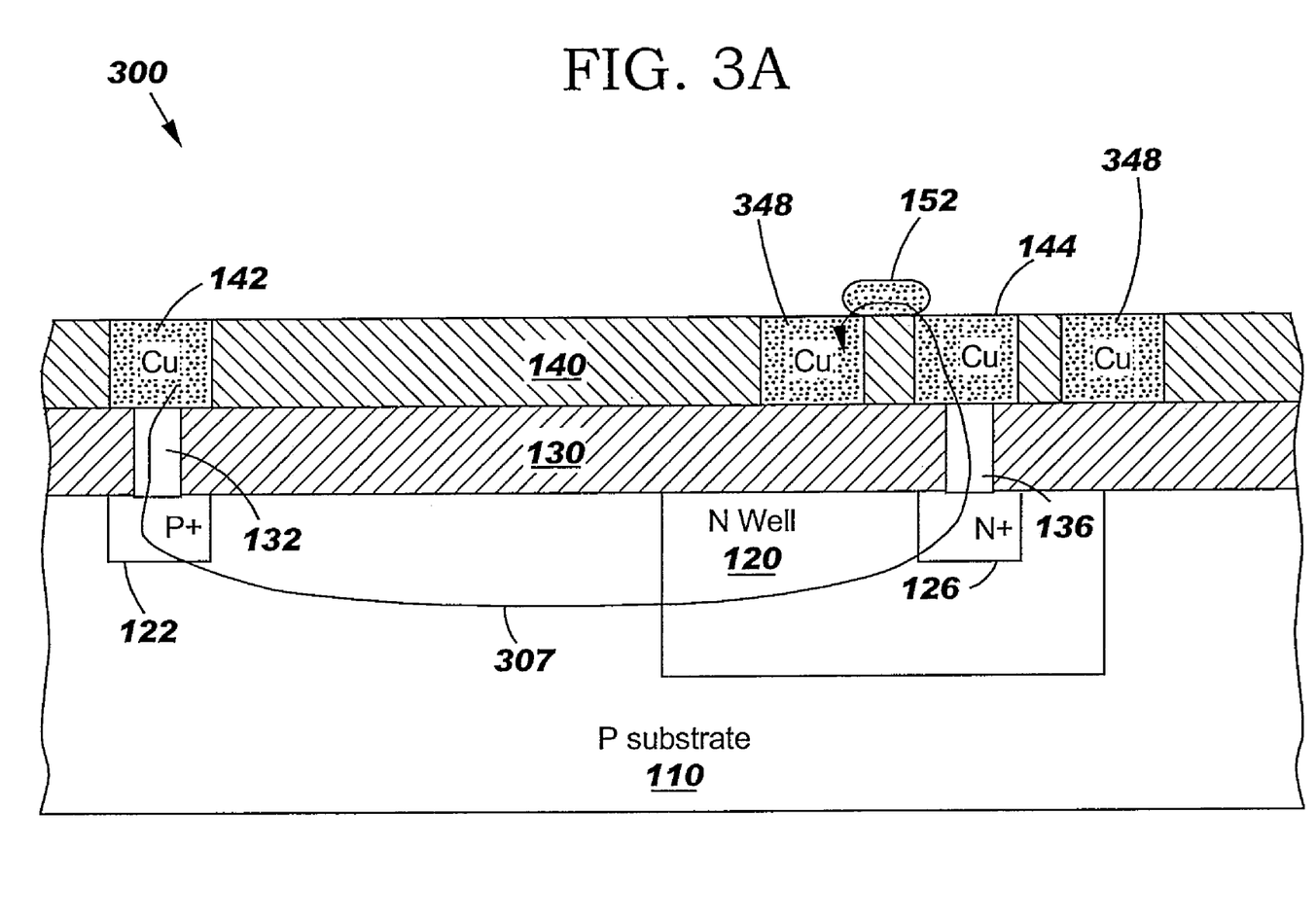
FIGS. 3A-3B illustrate cross-sectional and top views, respectively, of yet another semiconductor structure for monitoring LMPF, in accordance with embodiments of the present invention.
Figure 3B:
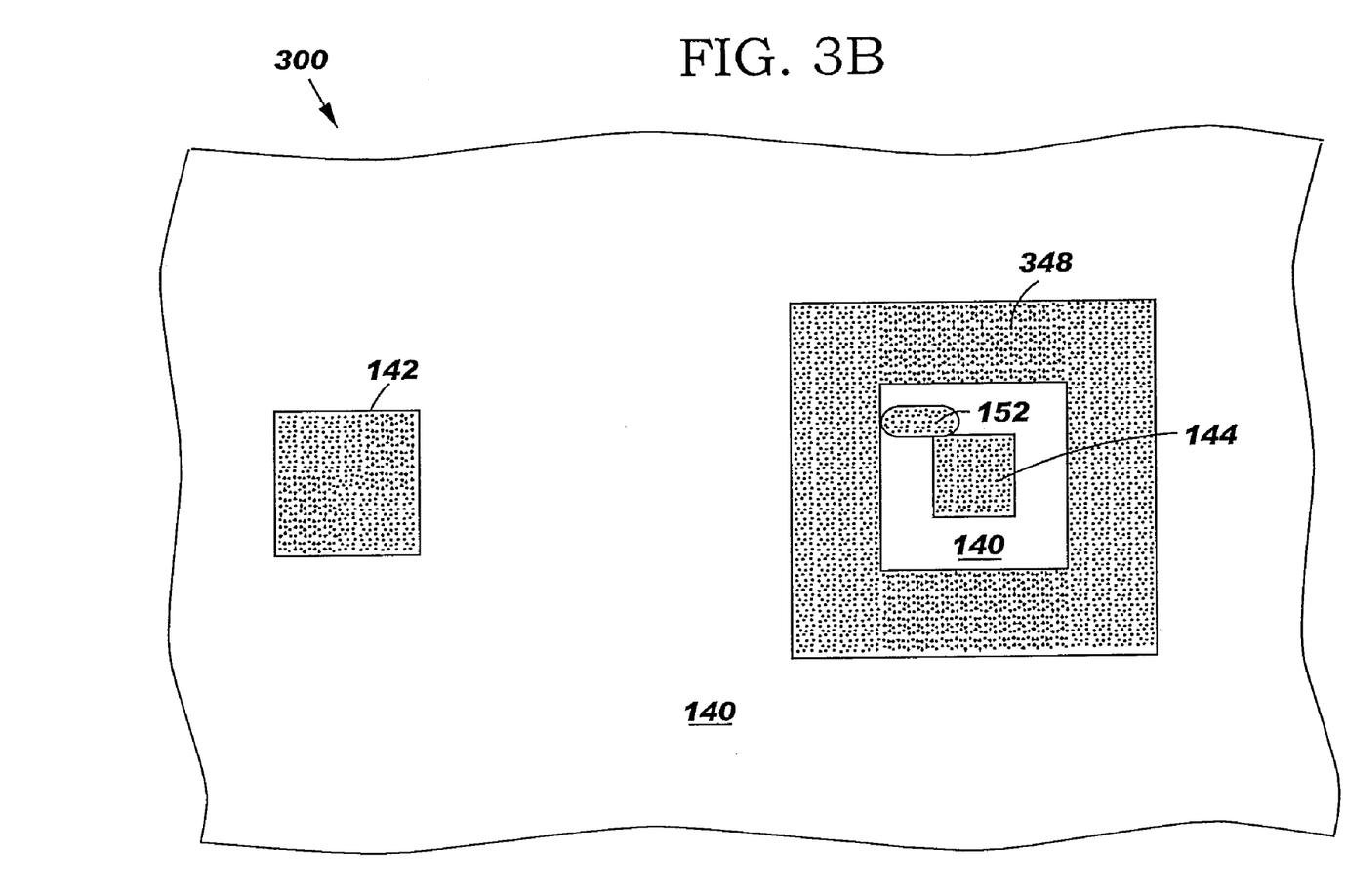

FIGS. 3A-3B illustrate cross-sectional and top views, respectively, of yet another semiconductor structure 300 for monitoring LMPF, in accordance with embodiments of the present invention. The structure 300 is similar to the structure 100*a* of FIG. 1A, except that the P+ region 124*a* and the via 134*a* are omitted and that a monitoring ramp terminal 348 is formed around and electrically disconnected from the Cu wire 144. This is intentionally done to exacerbate LMPF. In one embodiment, the monitoring ramp terminal 348 may comprise copper or any conducting material.

In one embodiment, a voltage difference is applied to the monitoring ramp terminal 348 and the Cu wire 144. If there is no LMP formed at the Cu wire 144 (like the LMP 152), the resulting current flowing between the monitoring ramp terminal 348 and the Cu wire 144 should be low (~pA) due only to leakage current. If there is LPM formed at the Cu wire 144 (like the LMP 152), the resulting current flowing between the monitoring ramp terminal 348 and the Cu wire 144 through the LMP 152 will be high (~µA or higher). As a result, by applying a voltage difference to the monitoring ramp terminal 348 and the Cu wire 144 and measuring the resulting current flowing between the two terminals 348 and 144, it can be determined whether LMPF exists at the Cu wire 144. In one embodiment, if the measured current flowing between the two terminals 348 and 144 exceeds a pre-specified value, it is determined that LMP is formed at the terminal 144 and the structure 300 has identified a process sensitivity to LMPF.

In an alternative embodiment, a voltage difference is applied to the monitoring ramp terminal 348 and the Cu wire 142 (as opposed to the Cu wire 144). If there is no LMP formed at the Cu wire 144 (like the LMP 152), the resulting current flowing between the monitoring ramp terminal 348 and the Cu wire 142 should be low (~pA) due only to current leakage. If there is LMP formed at the Cu wire 144 (like the LMP 152), the resulting current flowing between the monitoring ramp terminal 348 and the Cu wire 142 will be high (~µA or higher). One possible current path may be from the Cu wire 142 through the via 132, the P+ region 122, the N well 120, the N+ region 126, the via 136, the Cu wire 144, and the LMP 152 to the monitoring ramp terminal 348 (i.e., path 307), assuming the voltage of the Cu wire 142 is higher than that of the monitoring ramp terminal 348. As a result, by applying a voltage difference to the monitoring ramp terminal 348 and the Cu wire 142 and measuring the resulting current flowing between the two terminals 348 and 142, it can be determined whether LMPF exists at the Cu wire 144, and the process sensitivity to LMPF is determined.

For the structure 300, the monitoring ramp terminal 348 is formed around and electrically disconnected from the Cu wire 144 where LMP may be formed. LMP may be formed at the Cu wire 144 because the Cu wire 144 is exposed to an ionic solution and is electrically coupled to a N region (the N well 120). In general, a monitoring ramp terminal like the monitoring ramp terminal 348 may be formed around and electrically disconnected from any conducting wire which is exposed to an ionic solution and is electrically coupled to a N region.

In one embodiment, for the structure 300, a monitoring terminal like the regions 142,132,122 can be specially formed for monitoring LMPF at the wire 144. In another embodiment, any ground pad near the ramping terminal 348 can be used as the monitoring terminal for monitoring LMPF at the wire 144.

For the structure 200 of FIG. 2, a monitoring ramp terminal (not shown) similar to the monitoring ramp terminal 348 of FIG. 3 may be formed around and electrically disconnected from the Cu wire 242, where copper LMP may deposit. Then, by applying a voltage difference to the monitoring ramp terminal and the Cu wire 242 (or the Cu wire 244) and measuring the resulting current flowing between the two terminals, it can be determined whether LMPF exists at the Cu wire 242. In one embodiment, if the measured current flowing between the two terminals 348 and 242 exceeds a pre-specified value, it is determined that LMP is formed at the terminal 242 and the structure 200 has identified a process sensitivity to LMPF.

With reference to FIG. 3, it has been shown that the likelihood of LMPF occurring at the Cu wire 144 of the structure 300 depends on an LMPF likelihood ratio of a first area of the N well 120 to a second area of the Cu wire 144. Increasing this ratio creates more free electrons during excitation of the N well 120 allowing more Cu ions to combine with the free electrons and accumulate on Cu wire 144. This means that the higher the LMPF likelihood ratio is, the more sensitive (i.e., prone) to LMPF the structure 300 becomes.

In one embodiment, multiple structures similar to the structure 300 of FIG. 3 (hereafter, referred to as the structures 300) are formed on a wafer (not shown). The multiple structures 300 have various LMPF likelihood ratios, for example, 100:1, 250:1, 300:1, 750:1, etc. Then, during fabrication processes performed on the wafer, LMPF is monitored at the Cu wires 144 of these multiple structures 300. Based on the monitoring data, the fabrication process sensitivity to LMPF can be determined.

For example, assume that no LMPF is detected at the structures 300 having the LMPF likelihood ratios of 250:1 or lower, and that LMPF is detected at the structures 300 having the LMPF likelihood ratios of 300:1 or higher. As a result, it can be said that the particular fabrication process is sensitive to LMPF for LMPF likelihood ratios of 300:1 or higher. From this information, the design can be changed so as to avoid damages resulting from LMPF by making sure that all LMPF likelihood ratios through out the wafer are 250:1 or lower. The LMPF likelihood ratio of 300:1 can be referred to as the sensitivity degree of the fabrication process. Typically, LMPF likelihood ratios of the structures 300 lie between, but are not limited to, the range of 100:1 and 750:1.

While above discussions focus on the suppression of LMPF at the cathode, the similar arguments also apply to the anode side. If the current between the cathode and the anode is reduced, the metal depletion at the anode will also be suppressed.

In the embodiments described above, copper wires are used. In general, any conducting material can be used.

In the embodiments described above, silicide materials are used. In general, any materials that can reduce the light reaching and exciting the n-doped and p-doped regions can be used.

While particular embodiments of the present invention have been described herein for purposes of illustration, many modifications and changes will become apparent to those skilled in the art. Accordingly, the appended claims are intended to encompass all such modifications and changes as fall within the true spirit and scope of this invention.

The invention claimed is:

1. A method for identifying LMPF (Localized Metal Precipitate Formation) in a semiconductor structure, the method comprising:
   providing the semiconductor structure which includes
   (a) a first electrically conductive wire,
   (b) a first semiconductor region doped with N type dopants and electrically coupled to the first electrically conductive wire,
   (c) a monitoring ramp terminal being near the first electrically conductive wire and electrically disconnected from the first electrically conductive wire,
   (d) a second electrically conductive wire, and
   (e) a second semiconductor region doped with P type dopants and electrically coupled to the second electrically conductive wire;
   applying a voltage difference to the monitoring ramp terminal and a select wire selected from the group consisting of the first and second electrically conductive wires; and
   measuring a current flowing between the select wire and the monitoring ramp terminal so as to determine whether LMPF occurs at the first electrically conductive wire.

2. The method of claim 1, further comprising determining that LMPF occurs at the first electrically conductive wire if the measured current exceeds a pre-specified value.

3. The method of claim 1, wherein the select wire is the first electrically conductive wire.

4. The method of claim 1, wherein the select wire is the second electrically conductive wire.

5. The method of claim 1, wherein a ratio of a first area of the first semiconductor region to a second area of the first electrically conductive wire is between 100:1 and 750:1.

6. A method for monitoring a semiconductor wafer, the method comprising:
   providing the semiconductor wafer which includes a plurality of structures, wherein each structure of the plurality of structures comprises
   (a) a first electrically conductive wire,
   (b) a first semiconductor region doped with N type dopants and electrically coupled to the first electrically conductive wire,
   (c) a monitoring ramp terminal being near the first electrically conductive wire and electrically disconnected from the first electrically conductive wire,
   (d) a second electrically conductive wire, and
   (e) a second semiconductor region doped with P type dopants and electrically coupled to the second electrically conductive wire,
   wherein a LMPF ratio of each structure of the plurality of structures is a ratio of a first area of the first semiconductor region to a second area of the first electrically conductive wire; and
   monitoring LMPF for each structure of the plurality of structures, wherein said monitoring LMPF for each structure of the plurality of structures comprises:
   (A) applying a voltage difference to the monitoring ramp terminal and a select wire selected from the group consisting of the first and second electrically conductive wires, and
   (B) measuring a current flowing between the select wire and the monitoring ramp terminal so as to determine whether LMPF occurs at the first electrically conductive wire.

7. The method of claim 6, wherein said monitoring further comprising, for each each structure of the plurality of structures, determining that LMPF occurs at the first electrically conductive wire if the measured current exceeds a pre-specified value.

8. The method of claim 6, wherein the LMPF ratio of each structure of the plurality of structures are between 100:1 and 750:1.

* * * * *